United States Patent
Sawano

(10) Patent No.: US 12,166,342 B2
(45) Date of Patent: Dec. 10, 2024

(54) POWER SUPPLY CONTROL DEVICE, TEST METHOD, AND COMPUTER PROGRAM

(71) Applicants: AutoNetworks Technologies, Ltd., Yokkaichi (JP); Sumitomo Wiring Systems, Ltd., Yokkaichi (JP); Sumitomo Electric Industries, Ltd., Osaka (JP)

(72) Inventor: Shunichi Sawano, Yokkaichi (JP)

(73) Assignees: AutoNetworks Technologies, Ltd., Yokkaichi (JP); Sumitomo Wiring Systems, Ltd., Yokkaichi (JP); Sumitomo Electric Industries, Ltd., Osaka (JP)

( * ) Notice: Subject to any disclaimer, the term of this patent is extended or adjusted under 35 U.S.C. 154(b) by 99 days.

(21) Appl. No.: 17/995,863

(22) PCT Filed: Mar. 15, 2021

(86) PCT No.: PCT/JP2021/010289
§ 371 (c)(1),
(2) Date: Oct. 10, 2022

(87) PCT Pub. No.: WO2021/210319
PCT Pub. Date: Oct. 21, 2021

(65) Prior Publication Data
US 2023/0155367 A1    May 18, 2023

(30) Foreign Application Priority Data
Apr. 13, 2020    (JP) ................................. 2020-071837

(51) Int. Cl.
*H03K 17/082*    (2006.01)
*G01R 31/28*     (2006.01)
(Continued)

(52) U.S. Cl.
CPC ......... *H02H 3/087* (2013.01); *G01R 31/2829* (2013.01); *H02H 7/18* (2013.01); *H03K 17/0822* (2013.01)

(58) Field of Classification Search
CPC ............... H02H 3/087; H03K 17/0822; H03K 17/082–0828; G01R 31/2827; G01R 31/2829
See application file for complete search history.

(56) References Cited

U.S. PATENT DOCUMENTS

| | | | | |
|---|---|---|---|---|
| 5,926,010 A | * | 7/1999 | Hosokawa | ............. H02H 3/087 323/908 |
| 2013/0214805 A1 | * | 8/2013 | Saloio, Jr | ................ H02J 7/243 324/750.01 |

(Continued)

FOREIGN PATENT DOCUMENTS

| JP | 2004-140907 A | 5/2004 |
|---|---|---|
| JP | 2007-033108 A | 2/2007 |

OTHER PUBLICATIONS

International Search Report, Application No. PCT/JP2021/010289, mailed May 25, 2021. ISA/Japan Patent Office.

*Primary Examiner* — Jared Fureman
*Assistant Examiner* — Christopher J Clark
(74) *Attorney, Agent, or Firm* — Honigman LLP

(57) ABSTRACT

A power supply control device controls a supply of power by switching a FET on or off. A current that rises when a current flowing through the FET rises flows through a resistor circuit. A drive circuit makes a notification when a voltage across both ends of the resistor circuit reaches a voltage greater than or equal to a reference voltage. A microcomputer instructs an application circuit to apply a voltage to the resistor circuit. As a result, the application circuit applies a voltage greater than or equal to the reference voltage to the resistor circuit. After instructing the application circuit to (Continued)

stop applying the voltage to the resistor circuit, the microcomputer determines whether or not the drive circuit is making the notification.

4 Claims, 8 Drawing Sheets

(51) Int. Cl.
*H02H 3/087* (2006.01)
*H02H 7/18* (2006.01)

(56) References Cited

U.S. PATENT DOCUMENTS

2018/0358800 A1  12/2018  Sawano et al.
2019/0058319 A1   2/2019  Sawano et al.

* cited by examiner

POWER SUPPLY CONTROL DEVICE, TEST METHOD, AND COMPUTER PROGRAM

CROSS-REFERENCE TO RELATED APPLICATIONS

This application is the U.S. national stage of PCT/JP2021/010289 filed on Mar. 15, 2021, which claims priority of Japanese Patent Application No. JP 2020-071837 filed on Apr. 13, 2020, the contents of which are incorporated herein.

TECHNICAL FIELD

The present disclosure relates to a power supply control device, a test method, and a computer program.

BACKGROUND

JP 2017-103963A discloses a vehicular power supply control device that controls the supply of power from a battery to a load. In this power supply control device, a switch is disposed in a current path of current flowing from the battery to the load. The supply of power from the battery to the load is controlled by turning the switch on or off.

In the power supply control device described in JP 2017-103963A, when the current flowing through the switch rises, the rising current flows through a resistor circuit. A resistor is included in the resistor circuit. When the voltage across both ends of the resistor circuit reaches a voltage greater than or equal to a predetermined voltage, the switch turns off, as the current flowing through the current path is large. As a result, overcurrent is prevented from flowing through the current path.

In a conventional power supply control device, such as that described in JP 2017-103963A, when the voltage across both ends of the resistor circuit reaches a voltage greater than or equal to a predetermined voltage, the switch turns off and a notifying circuit makes a notification. If the notifying circuit does not make a notification appropriately, it is highly likely that the switch has not turned off appropriately. If the switch has not turned off appropriately, overcurrent cannot be prevented from flowing through the current path.

In recent years, self-driving vehicles, in which the driving is handled by computers, are being developed. A person does not do the driving in a self-driving vehicle, and there is thus a need for a configuration that reliably prevents overcurrent from flowing.

Accordingly, an object is to provide a power supply control device, a test method, and a computer program capable of testing a notifying circuit that makes a notification when a voltage across both ends of a resistor circuit reaches a voltage greater than or equal to a predetermined voltage.

SUMMARY

A power supply control device according to one aspect of the present disclosure is a power supply control device that controls a supply of power by switching a switch on or off. The power supply control device includes: a resistor circuit in which a current that rises when a current flowing through the switch rises flows; a notifying circuit configured to make a notification when a voltage across both ends of the resistor circuit reaches a voltage greater than or equal to a predetermined voltage; an application circuit configured to apply a voltage greater than or equal to the predetermined voltage to the resistor circuit; and a processing unit configured to execute processing. The processing unit instructs the application circuit to apply the voltage to the resistor circuit, and determines whether or not the notifying circuit is making the notification after instructing the application circuit to apply the voltage.

A test method according to one aspect of the present disclosure is a test method, executed by a computer, for testing a notifying circuit that makes a notification when a voltage across both ends of a resistor circuit, in which a current that rises when a current flowing through the switch rises flows, reaches a voltage greater than or equal to a predetermined voltage. The test method includes: a step of instructing a voltage greater than or equal to the predetermined voltage to be applied to the resistor circuit; and a step of determining whether or not the notifying circuit is making the notification after instructing the voltage to be applied to the resistor circuit.

A computer program according to one aspect of the present disclosure is a computer program for causing a computer to test a notifying circuit that makes a notification when a voltage across both ends of a resistor circuit, in which a current that rises when a current flowing through the switch rises flows, reaches a voltage greater than or equal to a predetermined voltage. The computer program causes the computer to execute: a step of instructing a voltage greater than or equal to the predetermined voltage to be applied to the resistor circuit; and a step of determining whether or not the notifying circuit is making the notification after instructing the voltage to be applied to the resistor circuit.

Note that the present disclosure can be realized not only as a power supply control device including such characteristic processing units, but also as a test method that takes the characteristic processes as steps, a computer program that causes a computer to execute those steps, and so on. Additionally, the present disclosure can be realized as a semiconductor integrated circuit that implements some or all of the power supply control device, and as a power source system that includes the power supply control device.

Effects of the Present Disclosure

According to the present disclosure, a notifying circuit that makes a notification when a voltage across both ends of a resistor circuit reaches a voltage greater than or equal to a predetermined voltage can be tested.

DETAILED DESCRIPTION OF PREFERRED EMBODIMENTS

Figure 1:
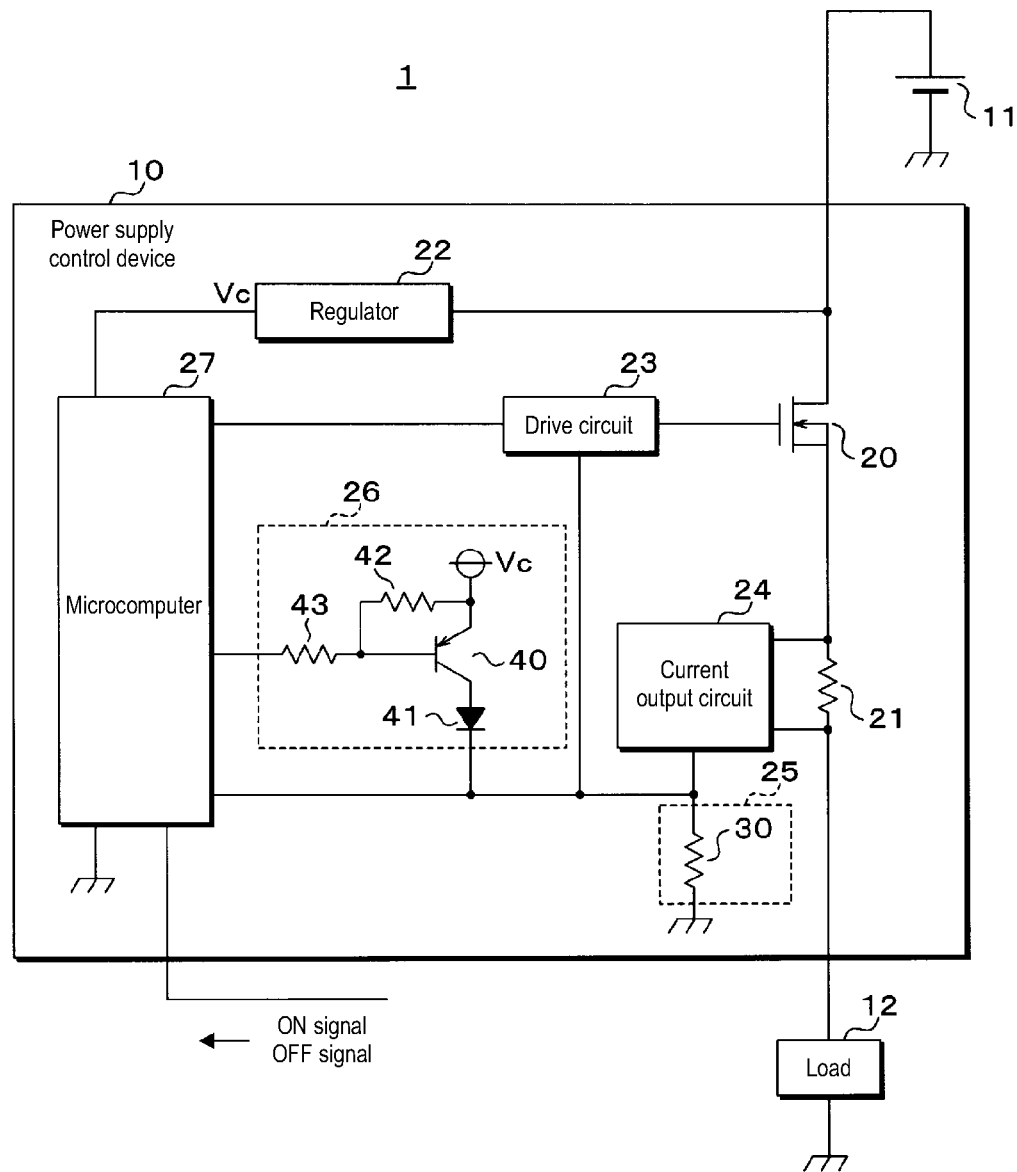
FIG. 1 is a block diagram illustrating the primary configuration of a power source system according to a first embodiment.

First, embodiments of the present disclosure will be described as examples. The embodiments described hereinafter may be at least partially combined as desired.

First Aspect

A power supply control device according to a first aspect of the present disclosure is a power supply control device that controls a supply of power by switching a switch on or off. The power supply control device includes: a resistor circuit in which a current that rises when a current flowing through the switch rises flows; a notifying circuit configured to make a notification when a voltage across both ends of the resistor circuit reaches a voltage greater than or equal to a predetermined voltage; an application circuit configured to apply a voltage greater than or equal to the predetermined voltage to the resistor circuit; and a processing unit configured to execute processing. The processing unit instructs the application circuit to apply the voltage to the resistor circuit, and determines whether or not the notifying circuit is making the notification after instructing the application circuit to apply the voltage.

Second Aspect

In the power supply control device according to a second aspect of the present disclosure, the notifying circuit makes the notification in response to a voltage greater than or equal to the predetermined voltage being applied to the resistor circuit, and the processing unit instructs the application circuit to stop applying the voltage after instructing the application circuit to apply the voltage, and after instructing the application circuit to stop applying the voltage, determines whether or not the notifying circuit is making the notification based on the voltage across both ends of the resistor circuit.

Third Aspect

The power supply control device according to a third aspect of the present disclosure further includes a switching unit configured to switch the switch off when the voltage across both ends of the resistor circuit reaches a voltage greater than or equal to the predetermined voltage, and the processing unit instructs the application circuit to apply the voltage to the resistor circuit when an off signal instructing the switch to turn off is input.

Fourth Aspect

In the power supply control device according to a fourth aspect of the present disclosure, the processing unit instructs the notifying circuit to stop applying the voltage when the notifying circuit is determined to be making the notification, and after instructing the notifying circuit to stop applying the voltage, determines whether or not the voltage across both ends of the resistor circuit is less than the predetermined voltage.

Fifth Aspect

A test method according to a fifth aspect of the present disclosure is a test method, executed by a computer, for testing a notifying circuit that makes a notification when a voltage across both ends of a resistor circuit, in which a current that rises when a current flowing through the switch rises flows, reaches a voltage greater than or equal to a predetermined voltage. The test method includes: a step of instructing a voltage greater than or equal to the predetermined voltage to be applied to the resistor circuit; and a step of determining whether or not the notifying circuit is making the notification after instructing the voltage to be applied to the resistor circuit.

Sixth Aspect

A computer program according to a sixth aspect of the present disclosure is a computer program for causing a computer to test a notifying circuit that makes a notification when a voltage across both ends of a resistor circuit, in which a current that rises when a current flowing through the switch rises flows, reaches a voltage greater than or equal to a predetermined voltage. The computer program causes the computer to execute: a step of instructing a voltage greater than or equal to the predetermined voltage to be applied to the resistor circuit; and a step of determining whether or not the notifying circuit is making the notification after instructing the voltage to be applied to the resistor circuit.

In the power supply control device, the test method, and the computer program according to the aspects described above, a voltage greater than or equal to the predetermined voltage is applied to the resistor circuit, and whether or not the notifying circuit is making a notification is determined. The notifying circuit is tested in this manner.

In the power supply control device according to the aspects described above, whether or not the notifying circuit is making a notification is determined based on whether or not the voltage across both ends of the resistor circuit is greater than or equal to the predetermined voltage after the application circuit has stopped applying the voltage. When the voltage across both ends of the resistor circuit is greater than or equal to the predetermined voltage, it is determined that the notification is being made. When the voltage across both ends of the resistor circuit is less than the predetermined voltage, it is determined that the notifying circuit is not making the notification.

In the power supply control device according to the aspects described above, when the current flowing through the switch rises, the voltage across both ends of the resistor circuit rises. The switch is switched off when the voltage across both ends of the resistor circuit reaches a voltage greater than or equal to the predetermined voltage. This prevents overcurrent from flowing through the switch. The notifying circuit is tested at a timing when an off signal is input, i.e., at a timing at which the switch is requested to switch off. If a fault has not occurred in the device, the switch switches off at the point in time when the application circuit applies a voltage greater than or equal to the predetermined voltage to the resistor circuit.

In the power supply control device according to the embodiments described above, whether or not the voltage across both ends of the resistor circuit is less than the predetermined voltage is determined after the application of the voltage to the resistor circuit by the notifying circuit is stopped. Through this, it is confirmed that the voltage across both ends of the resistor circuit has returned to a voltage less than the predetermined voltage.

Specific examples of the power source system according to embodiments of the present disclosure will be described hereinafter with reference to the drawings. Note that the present disclosure is not intended to be limited to these examples, and is defined instead by the scope of the appended claims. All changes that fall within the same essential spirit as the scope of the claims are intended to be included therein as well.

First Embodiment

Configuration of Power Source System

FIG. 1 is a block diagram illustrating the primary configuration of a power source system 1 according to a first embodiment. The power source system 1 can be favorably installed in a vehicle, and includes a power supply control device 10, a DC power source 11, and a load 12. The DC power source 11 is, for example, a battery. The load 12 is an electrical device installed in the vehicle.

The power supply control device 10 has an N-channel FET (Field Effect Transistor) 20, which functions as a switch, and a shunt resistor 21. The positive electrode of the DC power source 11 is connected to the drain of the FET 20. The source of the FET 20 is connected to one end of the shunt resistor 21. The other end of the shunt resistor 21 is connected to one end of the load 12. The negative electrode of the DC power source 11 and the other end of the load 12 are grounded.

When the FET 20 is on, the resistance value between the drain and the source of the FET 20 is sufficiently low, which enables current to flow through the drain and the source of the FET 20. When the FET 20 is off, the resistance value between the drain and the source of the FET 20 is sufficiently high, and thus no current flows through the drain and the source of the FET 20.

The power supply control device 10 switches the FET 20 on or off. When the FET 20 is switched on, current flows from the positive electrode of the DC power source 11 to the FET 20, the shunt resistor 21, the load 12, and the negative electrode of the DC power source 11 in that order, and the power is thus supplied to the load 12. The load 12 operates while the power is being supplied to the load 12. When the FET 20 is switched off, the power supply to the load 12 stops and the load 12 stops operating.

As described above, the power supply control device 10 controls the supply of power from the DC power source 11 to the load 12 by switching the FET 20 on or off.

An on signal instructing the FET 20 to switch on and an off signal instructing the FET 20 to switch off are input to the power supply control device 10. The power supply control device 10 switches the FET 20 on when the on signal is input. The power supply control device 10 switches the FET 20 off when the off signal is input.

Configuration of Power Supply Control Device 10

In addition to the FET 20 and the shunt resistor 21, the power supply control device 10 includes a regulator 22, a drive circuit 23, a current output circuit 24, a resistor circuit 25, an application circuit 26, and a microcomputer 27. The resistor circuit 25 includes a detection resistor 30.

The drain and the gate of the FET 20 are connected to the regulator 22 and the drive circuit 23, respectively. One end and the other end of the shunt resistor 21 are connected separately to the current output circuit 24. The current output circuit 24 is furthermore connected to one end of the detection resistor 30 of the resistor circuit 25. The other end of the detection resistor 30 is grounded. One end and the other end of the detection resistor 30 correspond to one end and the other end of the resistor circuit 25, respectively. A connection node between the current output circuit 24 and the detection resistor 30 is connected to the drive circuit 23, the application circuit 26, and the microcomputer 27. Each of the regulator 22, the drive circuit 23, and the application circuit 26 is further connected to the microcomputer 27. The microcomputer 27 is also grounded.

The FET 20 is on when the voltage at the gate of the FET 20, a reference potential of which is a ground potential, is greater than or equal to a certain on voltage. The FET 20 is off when the voltage at the gate of the FET 20, the reference potential of which is the ground potential, is less than a certain off voltage. The on voltage is greater than the off voltage. The off voltage is a positive voltage. The drive circuit 23 switches the FET 20 on by increasing the voltage at the gate of the FET 20, the reference potential of which is the ground potential, to a voltage greater than or equal to the on voltage. The drive circuit 23 switches the FET 20 off by reducing the voltage at the gate of the FET 20, the reference potential of which is the ground potential, to a voltage less than the off voltage.

mentioned above, when the FET 20 is on, current flows through the FET 20 and the shunt resistor 21 in that order. The current output circuit 24 outputs a current proportional to the current flowing through the shunt resistor 21 to the detection resistor 30 of the resistor circuit 25. Current output by the current output circuit 24 flows through the detection resistor 30 of the resistor circuit 25. In the following, the current flowing through the FET 20 will be denoted as "switch current". The current flowing through the shunt resistor 21 substantially matches the switch current. Therefore, the current output from the current output circuit 24 is substantially equal to (switch current)/(predetermined number), and rises when the switch current rises. The predetermined number is a positive real number, e.g., 4000.

Current output from the current output circuit 24 flows through the detection resistor 30 of the resistor circuit 25. The voltage across both ends of the detection resistor 30, i.e., the resistor circuit 25, is expressed as (current output from current output circuit 24)·(resistance value of detection resistor 30). In the following, the voltage across both ends of the resistor circuit 25 will be denoted as a "voltage across both ends". As mentioned above, the current output from the current output circuit 24 is substantially equal to (switch current)/(predetermined number). Therefore, the voltage across both ends of the resistor circuit 25 is substantially equal to (switch current)·(resistance value of detection resistor 30)/(predetermined number), and is higher the greater the switch current is.

A voltage at the connection node between the current output circuit 24 and the detection resistor 30 is output to the drive circuit 23 and the microcomputer 27. Here, the reference potential for the voltage at the connection node is the ground potential. Therefore, the voltage at the connection node between the current output circuit 24 and the detection resistor 30 is the voltage across both ends of the resistor circuit 25.

The regulator 22 generates a constant voltage Vc by stepping down the output voltage of the DC power source 11, a reference potential of which is the ground potential, and applies the generated constant voltage Vc to the microcomputer 27. As a result, current flows from the positive electrode of the DC power source 11 to the regulator 22, the microcomputer 27, and the negative electrode of the DC power source 11 in that order, and power is supplied to microcomputer 27. The constant voltage Vc is 5.0 V, 3.3 V, or the like.

The microcomputer 27 outputs the voltage to the drive circuit 23. The reference potential of the output voltage of the microcomputer 27 is the ground potential. The microcomputer 27 switches the output voltage output to the drive circuit 23 to a high-level voltage or a low-level voltage. The high-level voltage is higher than the low-level voltage. The high-level voltage corresponds to the constant voltage Vc, for example. The low-level voltage is, for example, zero V. The drive circuit 23 switches the FET 20 on or off based on the output voltage of the microcomputer 27 and the voltage across both ends of the resistor circuit 25.

If the microcomputer 27 switches the output voltage from the low-level voltage to the high-level voltage while the voltage across both ends of the resistor circuit 25 is less than a certain reference voltage, the drive circuit 23 switches the FET 20 on. If the microcomputer 27 switches the output voltage from the high-level voltage to the low-level voltage while the voltage across both ends of the resistor circuit 25 is less than the reference voltage, the drive circuit 23 switches the FET 20 off.

When the voltage across both ends of the resistor circuit 25 reaches a voltage greater than or equal to the reference voltage while the output voltage of the microcomputer 27 is the high-level voltage, the drive circuit 23 switches the FET 20 off and applies a voltage to the resistor circuit 25. The voltage applied by the drive circuit 23 to the resistor circuit 25 will be denoted as a "notification voltage". The notification voltage is a voltage greater than or equal to the reference voltage. A reference potential of the notification voltage is the ground potential.

By applying the notification voltage to the resistor circuit 25, the drive circuit 23 notifies the microcomputer 27 that the voltage across both ends of the resistor circuit 25 has reached a voltage greater than or equal to the reference voltage. When the microcomputer 27 switches the output voltage from the high-level voltage to the low-level voltage, the drive circuit 23 stops applying the notification voltage to the resistor circuit 25 while keeping the FET 20 off.

When the output voltage of the microcomputer 27 is the low-level voltage, the drive circuit 23 keeps the FET 20 off regardless of the voltage across both ends of the resistor circuit 25.

The application circuit 26 applies the voltage to the resistor circuit 25 and stops applying the voltage to the resistor circuit 25 according to instructions from the microcomputer 27. The voltage applied by the application circuit 26 to the resistor circuit 25 will be denoted as an "applied voltage". The applied voltage is a voltage greater than or equal to the reference voltage. A reference potential of the applied voltage is the ground potential.

The on signal and the off signal are input to the microcomputer 27. When the on signal is input, the microcomputer 27 switches the output voltage being output to the drive circuit 23 from the low-level voltage to the high-level voltage. As a result, the drive circuit 23 switches the FET 20 on. As mentioned above, when the FET 20 is on, current flows through the FET 20, the shunt resistor 21, and the load 12 in that order, and power is supplied to the load 12. The current output circuit 24 outputs a current proportional to the current flowing through the shunt resistor 21 to the detection resistor 30 of the resistor circuit 25.

When the off signal is input, the microcomputer 27 instructs the application circuit 26 to apply a voltage. As a result, the application circuit 26 applies a voltage greater than or equal to the reference voltage to both ends of the resistor circuit. As a result, the voltage across both ends of the resistor circuit 25 reaches a voltage greater than or equal to the reference voltage, and thus the drive circuit 23 switches the FET 20 off. As mentioned above, when the voltage across both ends of the resistor circuit 25 has reached a voltage greater than or equal to the reference voltage, the drive circuit 23 makes a notification by applying the notification voltage to the resistor circuit 25.

The microcomputer 27 instructs the application circuit 26 to apply the voltage, and then instructs the application circuit 26 to stop applying the voltage. As a result, the application circuit 26 stops applying a voltage greater than or equal to the reference voltage. If no fault has occurred in the power supply control device 10, the drive circuit 23 continues to apply the voltage greater than or equal to the reference voltage after the application circuit 26 has stopped applying voltage. After instructing the application circuit 26 to stop applying the voltage, the microcomputer 27 determines whether or not the drive circuit 23 is making a notification based on the voltage across both ends of the resistor circuit 25. In this manner, the microcomputer 27 tests a notification function of the drive circuit 23.

The microcomputer 27 switches the output voltage to the low-level voltage after determining whether or not the drive circuit 23 is making a notification. As a result, the drive circuit 23 stops applying the notification voltage to the resistor circuit 25. After switching the output voltage to the low-level voltage, the microcomputer 27 determines whether or not the voltage across both ends of the resistor circuit 25 is less than the reference voltage. Through this, the microcomputer 27 can confirm that the voltage across both ends of the resistor circuit 25 has returned to a voltage less than the reference voltage.

Configuration of Application Circuit 26

The application circuit 26 includes a transistor 40, a diode 41, and circuit resistors 42 and 43. The transistor 40 is a PNP-type bipolar transistor and functions as a switch. When the transistor 40 is on, a resistance value between the emitter and the collector of the transistor 40 is sufficiently low, and current can therefore flow through the emitter and the collector of the transistor 40. When the transistor 40 is off, the resistance value between the emitter and the collector of the transistor 40 is sufficiently high, and therefore no current flows through the emitter and the collector of the transistor 40.

The cathode of the diode 41 is connected to a connection node between the current output circuit 24 and the detection resistor 30. The anode of the diode 41 is connected to the collector of the transistor 40. The circuit resistor 42 is connected between the emitter and the base of the transistor 40. One end of the circuit resistor 43 is connected to the base of the transistor 40. The other end of the circuit resistor 43 is connected to the microcomputer 27. Like the microcomputer 27, the constant voltage Vc is applied to the emitter of the transistor 40.

The configuration of applying the constant voltage Vc to the emitter of the transistor 40 may be realized by the regulator 22 applying the constant voltage Vc.

In the transistor 40, if the voltage at the base, where the reference potential is the potential of the emitter, is less than a certain voltage threshold, the transistor 40 is on. The voltage threshold is a negative voltage. In the transistor 40, if the voltage at the base, where the reference potential is the potential of the emitter, is greater than or equal to the voltage threshold, the transistor 40 is off.

The microcomputer 27 adjusts the voltage at the other end of the circuit resistor 43 of the application circuit 26. In the following, the voltage at the other end of the circuit resistor 43 will be denoted as a "resistor voltage". A reference potential of the resistor voltage is the ground potential. The transistor 40 is switched on or off by the microcomputer 27. The microcomputer 27 reduces the resistor voltage to a sufficiently low voltage, e.g., zero V. As a result, current flows from the emitter of the transistor 40 to the circuit resistors 42 and 43 in that order, and a voltage drop occurs in the circuit resistor 42. At this time, the current flowing through the circuit resistor 42 is large, and thus in the transistor 40, the voltage at the base, where the reference potential is the potential of the emitter, is less than the voltage threshold. The transistor 40 is switched on as a result.

The microcomputer 27 raises the resistor voltage to a sufficiently high voltage, e.g., the constant voltage Vc. This causes the current flowing through the circuit resistor 42 to drop to zero A or a value near zero A. At this time, in the transistor 40, the voltage at the base, where the reference potential is the potential of the emitter, rises to zero V or a value near zero V, which is greater than or equal to the voltage threshold. Therefore, the transistor 40 is switched off.

The microcomputer 27 switches the transistor 40 on or off in this manner.

When the transistor 40 is switched from off to on, current flows through the transistor 40, the diode 41, and the resistor circuit 25 in that order, and the application circuit 26 applies the voltage to the resistor circuit 25. In the diode 41, the range of the voltage drop that occurs in the diode 41 when current flows in the order of the anode and the cathode will be denoted as "forward voltage". The applied voltage applied by the application circuit 26 to the resistor circuit 25 is expressed as (constant voltage Vc)—(forward voltage). As mentioned above, the applied voltage is greater than or equal to the reference voltage.

When the transistor 40 is switched from on to off, the flow of current through the transistor 40 and the diode 41 stops, and the application circuit 26 stops applying voltage to the resistor circuit 25.

As described above, the microcomputer 27 instructs the application circuit 26 to apply the voltage to the resistor circuit 25 by reducing the resistor voltage to a sufficiently low voltage. As a result, the transistor 40 is switched on and the application circuit 26 applies a voltage greater than or equal to the reference voltage to the resistor circuit 25. The microcomputer 27 instructs the application circuit 26 to stop applying the voltage to the resistor circuit 25 by increasing the resistor voltage to a sufficiently high voltage. As a result, the transistor 40 is switched off and the application circuit 26 stops applying the voltage to the resistor circuit 25.

Configuration of Drive Circuit 23

Figure 2:
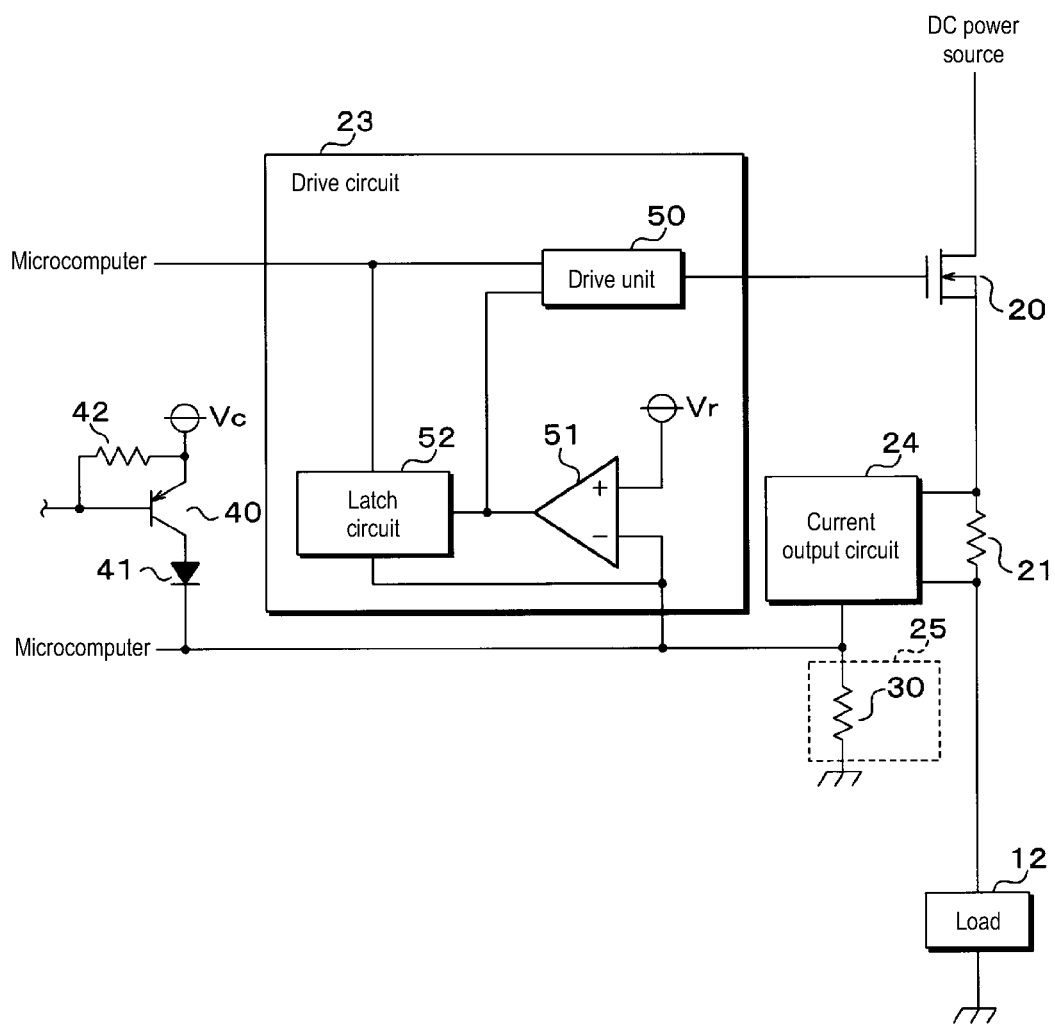
FIG. 2 is a block diagram illustrating the primary configuration of a drive circuit.

FIG. 2 is a block diagram illustrating the primary configuration of the drive circuit 23. The drive circuit 23 includes a drive unit 50, a comparator 51, and a latch circuit 52. The comparator 51 has a plus terminal, a minus terminal, and an output terminal. The gate of the FET 20 is connected to the drive unit 50. The drive unit 50 is further connected to the microcomputer 27. A connection node between the drive unit 50 and the microcomputer 27 is connected to the latch circuit 52. The output terminal of the comparator 51 is connected to the drive unit 50 and the latch circuit 52. The minus terminal of the comparator 51 and the latch circuit 52 are connected to a connection node between the current output circuit 24 and the resistor circuit 25. A reference voltage Vr is input to the plus terminal of the comparator 51. The reference voltage Vr is generated, for example, by a regulator (not shown) stepping down the output voltage of the DC power source 11.

The drive unit 50 switches the FET 20 on or off by adjusting the voltage at the gate of FET 20, for which the reference potential is the ground potential, as described above. The comparator 51 outputs a voltage from the output terminal to the drive unit 50 and the latch circuit 52. The reference potential of the output voltage from the comparator 51 is the ground potential. The comparator 51 switches the output voltage to the high-level voltage or the low-level voltage.

The comparator 51 is outputting the high-level voltage to the drive unit 50 and the latch circuit 52 when the voltage across both ends of the resistor circuit 25 is less than the reference voltage Vr. The comparator 51 switches the output voltage from the high-level voltage to the low-level voltage when the voltage across both ends of the resistor circuit 25 reaches a voltage that is greater than or equal to the reference voltage Vr. The comparator 51 switches the output voltage from the low-level voltage to the high-level voltage when the voltage across both ends of the resistor circuit 25 reaches a voltage that is less than the reference voltage Vr. The reference voltage Vr corresponds to a predetermined voltage.

The output voltage of the microcomputer 27 is output to the drive unit 50 and the latch circuit 52. The latch circuit 52 applies the notification voltage to the resistor circuit 25 when the output voltage of the comparator 51 switches from the high-level voltage to the low-level voltage while the output voltage of the microcomputer 27 is the high-level voltage. A notification is made as a result. As mentioned above, the notification voltage is a voltage greater than or equal to the reference voltage Vr. The latch circuit 52 functions as a notifying circuit. While the latch circuit 52 is applying the notification voltage to the resistor circuit 25, the output voltage of the comparator 51 is fixed at the low-level voltage. When the output voltage of the microcomputer 27 switches from the high-level voltage to the low-level voltage, the latch circuit 52 stops applying the notification voltage to the resistor circuit 25. The latch circuit 52 continues to stop the application of the notification voltage to the resistor circuit 25 until the output voltage of the comparator 51 switches from the high-level voltage to the low-level voltage while the output voltage of the microcomputer 27 is the high-level voltage.

The drive unit 50 switches the FET 20 on when the microcomputer 27 switches the output voltage from the low-level voltage to the high-level voltage while the comparator 51 is outputting the high-level voltage. The comparator 51 outputting the high-level voltage means that the voltage across both ends of the resistor circuit 25 is less than the reference voltage Vr. The drive unit 50 switches the FET 20 off when the microcomputer 27 switches the output voltage from the high-level voltage to the low-level voltage while the comparator 51 is outputting the high-level voltage.

The drive unit 50 switches the FET 20 off when the output voltage of the comparator 51 switches from the high-level voltage to the low-level voltage while the output voltage of the microcomputer 27 is the high-level voltage. The drive unit 50 therefore functions as a switching unit. As mentioned above, when the switch current rises, the voltage across both ends of the resistor circuit 25 rises. When the voltage across both ends of the resistor circuit 25 reaches a voltage greater than or equal to the reference voltage Vr, the output voltage of the comparator 51 switches from the high-level voltage to the low-level voltage, and the drive unit 50 switches the FET 20 off. This prevents overcurrent from flowing through the FET 20.

As mentioned above, when the output voltage of the comparator 51 switches from the high-level voltage to the low-level voltage while the output voltage of the microcomputer 27 is the high-level voltage, the latch circuit 52 fixes the output voltage of the comparator 51 to the low-level voltage by applying the notification voltage to the resistor circuit 25. When the output voltage of the microcomputer 27 switches to the low-level voltage, the latch circuit 52 stops applying the notification voltage and cancels the fixing.

When the output voltage of the microcomputer 27 is the low-level voltage, the drive unit 50 keeps the FET 20 off regardless of the output voltage of the comparator 51, i.e., the voltage across both ends of the resistor circuit 25.

Figure 3:
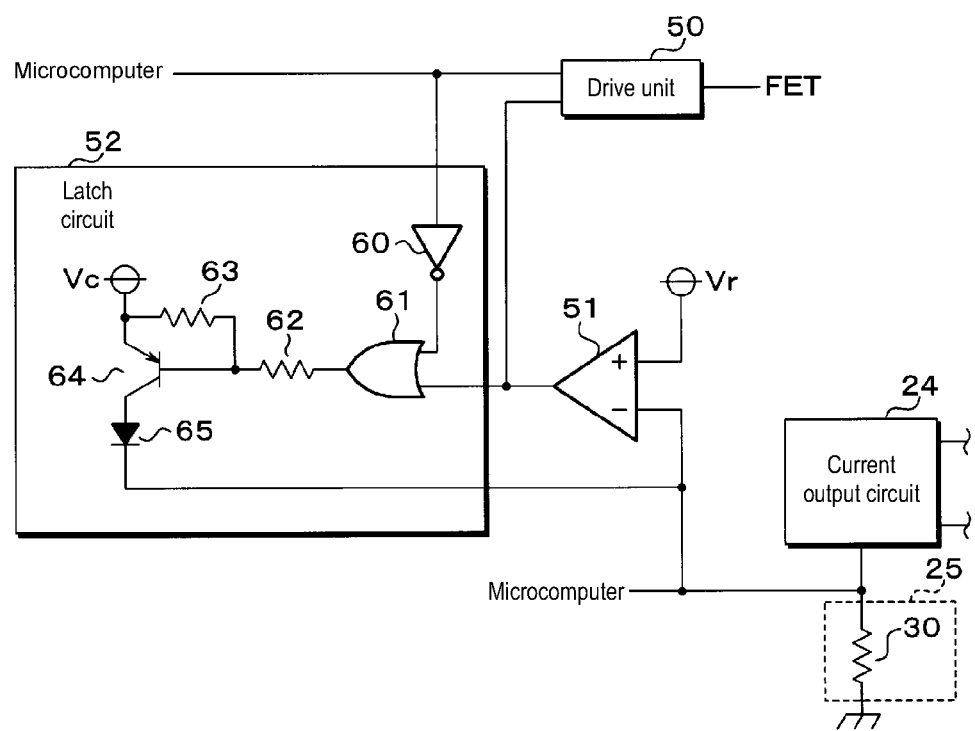
FIG. 3 is a circuit diagram illustrating a latch circuit.

FIG. 3 is a circuit diagram illustrating the latch circuit 52. The latch circuit 52 includes an inverter 60, an OR circuit 61, second circuit resistors 62 and 63, a second transistor 64, and a second diode 65. The inverter 60 has an input terminal and an output terminal. The OR circuit 61 has a first input terminal, a second input terminal, and an output terminal.

The second transistor 64 is a PNP-type bipolar transistor and functions as a switch. When the second transistor 64 is on, the resistance value between the emitter and the collector of the second transistor 64 is sufficiently low, and current can therefore flow through the emitter and the collector of the second transistor 64. When the second transistor 64 is off, the resistance value between the emitter and the collector of the second transistor 64 is sufficiently high, and therefore no current flows through the emitter and the collector of the second transistor 64.

The input terminal of the inverter 60 is connected to a connection node between the microcomputer 27 and the drive unit 50. The output terminal of the inverter 60 is connected to the first input terminal of the OR circuit 61. The second input terminal of the OR circuit 61 is connected to the output terminal of the comparator 51. The output terminal of the OR circuit 61 is connected to one end of the second circuit resistor 62. The other end of the second circuit resistor 62 is connected to the base of the second transistor 64. The second circuit resistor 63 is connected between the emitter and the base of the second transistor 64. The collector of the second transistor 64 is connected to the anode of the second diode 65. The cathode of the second diode 65 is connected to a connection node between the current output circuit 24 and the detection resistor 30 of the resistor circuit 25.

Like the microcomputer 27 and the transistor 40, the constant voltage Vc is applied to the emitter of the second transistor 64.

The configuration of applying the constant voltage Vc to the emitter of the second transistor 64 may be realized by the regulator 22 applying the constant voltage Vc.

The inverter 60 outputs a voltage to the OR circuit 61. The reference potential of the output voltage of the inverter 60 is the ground potential. The output voltage of the inverter 60 is a high-level voltage or a low-level voltage. The output voltage of the microcomputer 27 is input to the inverter 60. The inverter 60 outputs the low-level voltage to the OR circuit 61 when the output voltage of the microcomputer 27 is the high-level voltage. The inverter 60 outputs the high-level voltage to the OR circuit 61 when the output voltage of the microcomputer 27 is the low-level voltage.

In the second transistor 64, if the voltage at the base, where the reference potential is the potential of the emitter, is less than a certain second voltage threshold, the second transistor 64 is on. The second voltage threshold is a negative voltage. In the second transistor 64, if the voltage at the base, where the reference potential is the potential of the emitter, is greater than or equal to the second voltage threshold, the second transistor 64 is off.

The OR circuit 61 adjusts the voltage at the output terminal. As a result, the second transistor 64 is switched on or off. The OR circuit 61 reduces the voltage at the output terminal to a sufficiently low voltage, e.g., zero V. As a result, current flows from the emitter of the second transistor 64 to the second circuit resistors 63 and 62 in that order, and a voltage drop occurs in the second circuit resistor 63. At this time, the current flowing through the second circuit resistor 63 is large, and thus in the second transistor 64, the voltage at the base, where the reference potential is the potential of the emitter, is less than the second voltage threshold. The second transistor 64 is switched on as a result.

The OR circuit 61 raises the voltage of the output terminal to a sufficiently high voltage, e.g., the constant voltage Vc. This causes the current flowing through the second circuit resistor 62 to drop to zero A or a value near zero A. At this time, in the second transistor 64, the voltage at the base, where the reference potential is the potential of the emitter, is greater than or equal to the second voltage threshold, and thus the second transistor 64 is switched off.

The OR circuit 61 switches the second transistor 64 on or off in this manner.

The output voltages of the comparator 51 and the inverter 60 are input to the OR circuit 61. The OR circuit 61 switches the second transistor 64 from off to on when the output voltage of the comparator 51 switches from the high-level voltage to the low-level voltage while the output voltage of the inverter 60 is the low-level voltage. The output voltage of the inverter 60 being the low-level voltage means that the output voltage of the microcomputer 27 is the high-level voltage. When the second transistor 64 is switched from off to on, current flows through the second transistor 64, the second diode 65, and the resistor circuit 25 in that order, and the latch circuit 52 applies the notification voltage to the resistor circuit 25.

In the second diode 65, the range of the voltage drop that occurs in the second diode 65 when current flows in the order of the anode and the cathode will be denoted as "second forward voltage". The notification voltage applied by the latch circuit 52 to the resistor circuit 25 is expressed as (constant voltage Vc)—(second forward voltage). As mentioned above, the notification voltage is a voltage greater than or equal to the reference voltage. While the latch circuit 52 is applying the notification voltage to the resistor circuit 25, the voltage across both ends of the resistor circuit 25 is greater than or equal to the reference voltage Vr, and thus the comparator 51 continues to output the low-level voltage.

In this state, when the inverter 60 switches the output voltage from the low-level voltage to the high-level voltage, i.e., when the microcomputer 27 switches the output voltage from the high-level voltage to the low-level voltage, the OR circuit 61 switches the second transistor 64 from on to off. When the second transistor 64 is switched from on to off, the flow of current through the second transistor 64 and the second diode 65 stops, and the latch circuit 52 stops applying voltage to the resistor circuit 25. Then, the OR circuit 61 keeps the second transistor 64 off until the output voltage of the comparator 51 switches from the high-level voltage to the low-level voltage while the output voltage of the microcomputer 27 is the high-level voltage.

Configuration of Microcomputer 27

Figure 4:
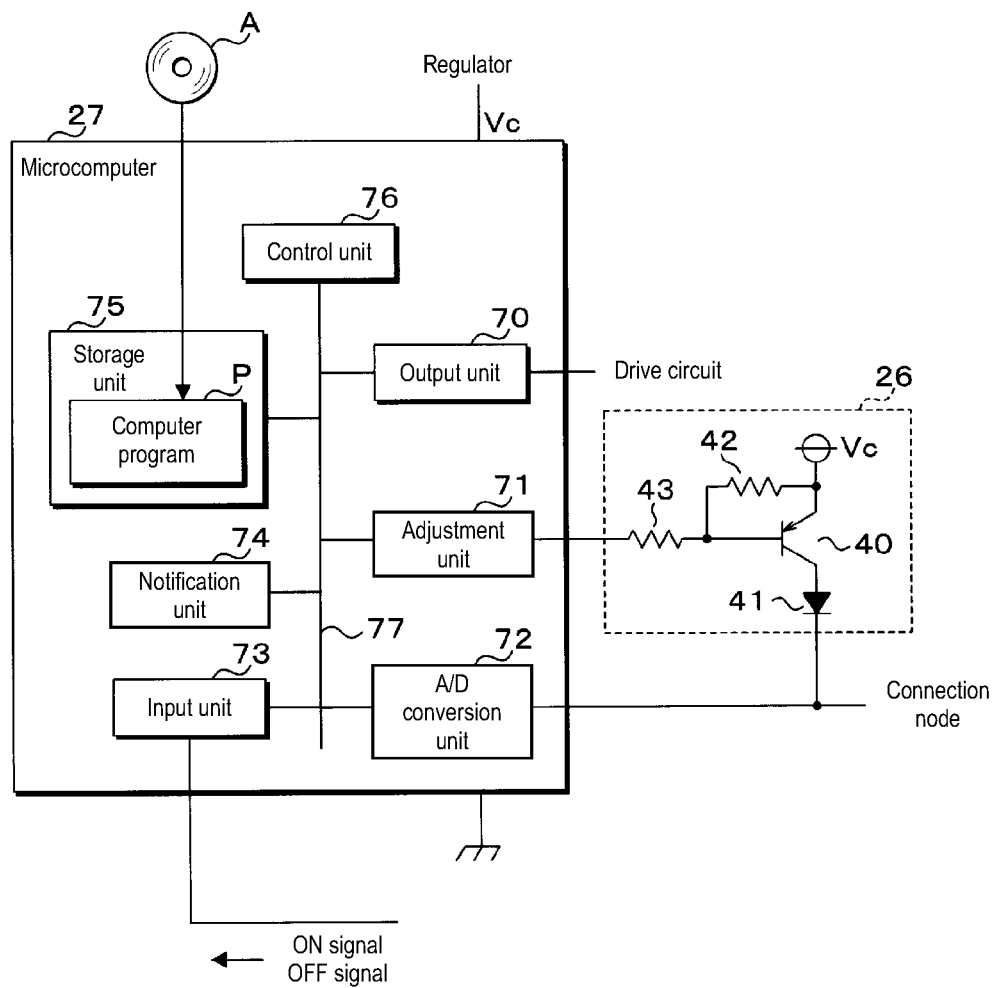
FIG. 4 is a block diagram illustrating the primary configuration of a microcomputer.

FIG. 4 is a block diagram illustrating the primary configuration of the microcomputer 27. The microcomputer 27 includes an output unit 70, an adjustment unit 71, an A/D conversion unit 72, an input unit 73, a notification unit 74, a storage unit 75, and a control unit 76. These are connected to an internal bus 77. The output unit 70 is further connected to the drive unit 50 of the drive circuit 23 and the inverter 60 of the latch circuit 52 included in the drive circuit 23. The adjustment unit 71 is further connected to the other end of the circuit resistor 43 of the application circuit 26. The A/D conversion unit 72 is further connected to the connection node between the current output circuit 24 and the resistor circuit 25.

The output unit 70 outputs a voltage to the drive unit 50 and the inverter 60. The output voltage of the output unit 70 is the output voltage of the microcomputer 27 described above. The output unit 70 switches the output voltage to a high-level voltage or a low-level voltage in response to instructions from the control unit 76.

The adjustment unit 71 switches the transistor 40 of the application circuit 26 on or off by adjusting the resistance voltage, i.e., the voltage at the other end of the circuit resistor 43. The adjustment unit 71 performs the switching of the transistor 40 in response to instructions from the control unit 76.

An analog value of the voltage across both ends of the resistor circuit 25 is input to the A/D conversion unit 72. The A/D conversion unit 72 performs A/D conversion, i.e., conversion from an analog value to a digital value, on the voltage across both ends of the resistor circuit 25. The control unit 76 obtains the digital value of the voltage across both ends of the resistor circuit 25 from the A/D conversion unit 72.

Figure 5:
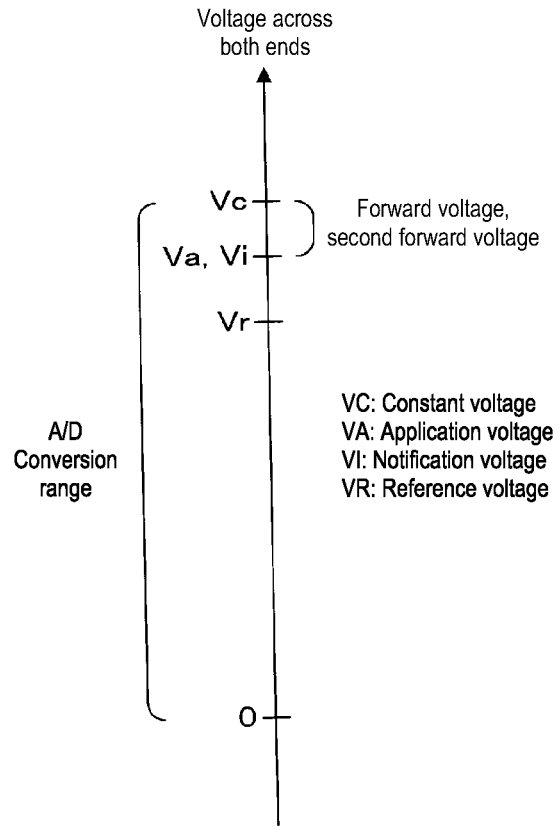
FIG. 5 is a descriptive diagram illustrating a range of a voltage across both ends, over which A/D conversion is performed.

FIG. 5 is a descriptive diagram illustrating a range of a voltage across both ends, over which A/D conversion is performed. A lower limit value of the range of the voltage across both ends, over which A/D conversion is performed, is zero V. An upper limit value of the range of the voltage across both ends, over which the A/D conversion is performed, is the constant voltage Vc applied to the microcomputer 27 by the regulator 22. The reference voltage Vr applied to the plus terminal of the comparator 51 is greater than zero V and less than the constant voltage Vc.

In FIG. 5, Va represents the applied voltage applied by the application circuit 26 to the resistor circuit 25. Vi represents the notification voltage applied by the latch circuit 52 of the drive circuit 23 to the resistor circuit 25. FIG. 5 illustrates an example where the forward voltage of the diode 41 matches the second forward voltage of the second diode 65. The applied voltage Va and the notification voltage Vi are each greater than or equal to the reference voltage Vr and less than or equal to the constant voltage Vc.

As illustrated in FIG. 4, the on signal and the off signal are input to the input unit 73. When a signal is input, the input unit 73 communicates the input signal to the control unit 76.

The notification unit 74 makes a notification in response to an instruction from the control unit 76. The control unit 76 causes the notification unit 74 to make the notification when the voltage across both ends of the resistor circuit 25 is fixed at a voltage greater than or equal to the reference voltage Vr, even if the latch circuit 52 has been instructed to stop the application of the notification voltage to the resistor circuit 25. The notification is realized by lighting a lamp, transmitting a signal through a communication line (not shown), or the like.

The storage unit 75 is non-volatile memory. A computer program P is stored in the storage unit 75. The control unit 76 includes a processing device that executes processing, e.g., a Central Processing Unit (CPUs), and functions as a processing unit. The control unit 76 executes on processing for switching the FET 20 on and off processing for switching the FET 20 off by executing the computer program P.

Note that the computer program P may be stored in a storage medium A so as to be readable by the processing device of the control unit 76. In this case, the computer program P read out from the storage medium A by a readout device (not shown) is written into the storage unit 75. The storage medium A is an optical disk, a flexible disk, a magnetic disk, a magneto-optical disk, semiconductor memory, or the like. The optical disk is a CD (Compact Disc)-ROM (Read Only Memory), DVD (Digital Versatile Disc)-ROM, a BD (Blu-ray) (registered trademark) Disc, or the like. The magnetic disk is a hard disk, for example. Additionally, the computer program P may be downloaded from a device (not shown) connected to a communication network (not shown), and the downloaded computer program P may be written into the storage unit 75.

The number of processing devices included in the control unit 76 is not limited to one, and may be two or more. In this case, the plurality of processing devices may cooperatively execute the on processing, the off processing, and the like in accordance with the computer program P.

In addition to the computer program P, a value of a fault flag is stored in the storage unit 75. The value of the fault flag indicates whether or not a notification is to be made by the latch circuit 52. The value of the fault flag being zero indicates that the notification is to be made. The value of the fault flag being 1 indicates that the notification is not to be made. The value of the fault flag is changed by the control unit 76.

On Processing

Figure 6:
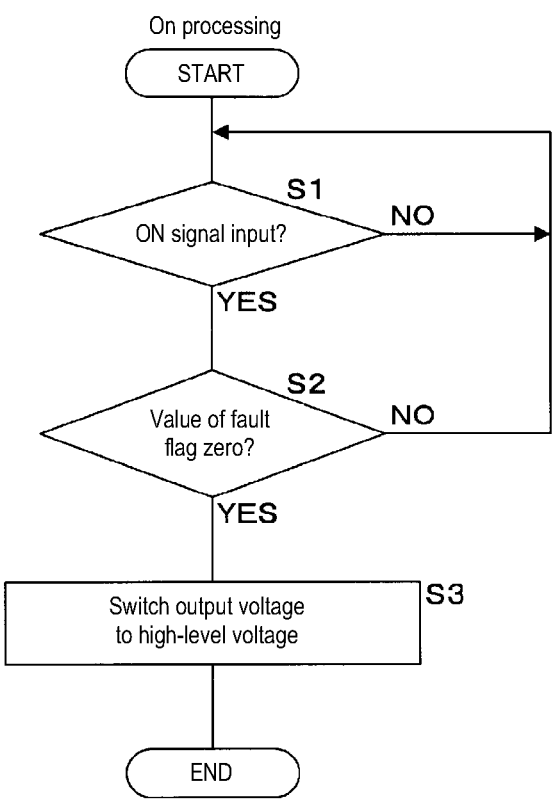
FIG. 6 is a flowchart illustrating a sequence of on processing.

FIG. 6 is a flowchart illustrating a sequence of the on processing. The control unit 76 executes the on processing when the microcomputer 27 has been started up or the execution of the off processing has ended. The on processing is executed while the output voltage of the output unit 70 is the low-level voltage. When the output voltage of the output unit 70 is the low-level voltage, the drive unit 50 of the drive circuit 23 keeps the FET 20 off. When the FET 20 is off, no current flows through the FET 20. Accordingly, the voltage across both ends of the resistor circuit 25 is less than the reference voltage, and the output voltage of the comparator 51 of the drive circuit 23 is the high-level voltage.

When the output voltage of the output unit 70 is the low-level voltage, the latch circuit 52 stops applying the notification voltage. At the point in time when the on processing is executed, the adjustment unit 71 causes the application circuit 26 to stop applying the applied voltage by keeping the resistor voltage, which is the voltage at the other end of the circuit resistor 43 of the application circuit 26, at a high voltage.

In the on processing, first, the control unit 76 determines whether or not the on signal has been input to the input unit 73 (step S1). If it is determined that the on signal has been input (S1: YES), the control unit 76 determines whether or not the value of the fault flag is zero (step S2). The value of the fault flag is 1 or zero, and thus the value of the fault flag not being zero means that the value of the fault flag is 1.

If it is determined that the on signal is not being input (S1: NO), or that the value of the fault flag is not zero (S2: NO), the control unit 76 executes step S1 again. While the value of the fault flag is zero, the control unit 76 stands by until the on signal is input to the input unit 73. If it is determined that the value of the fault flag is zero (S2: YES), the control unit 76 instructs the output unit 70 to switch the output voltage from the low-level voltage to the high-level voltage (step S3).

If a fault has not occurred in the power supply control device 10, the comparator 51 is outputting the high-level voltage at the point in time when step S3 is executed. When step S3 is executed while no fault has occurred in the power supply control device 10, the drive unit 50 switches the FET 20 on. The control unit 76 ends the on processing after executing step S3.

As described above, when the on signal is input while the value of the fault flag is zero, the drive unit 50 of the drive circuit 23 switches the FET 20 on, and power is supplied to the load 12 through the FET 20. When the value of the fault flag is 1, the drive unit 50 does not switch the FET 20 on.

Off Processing

Figure 7:
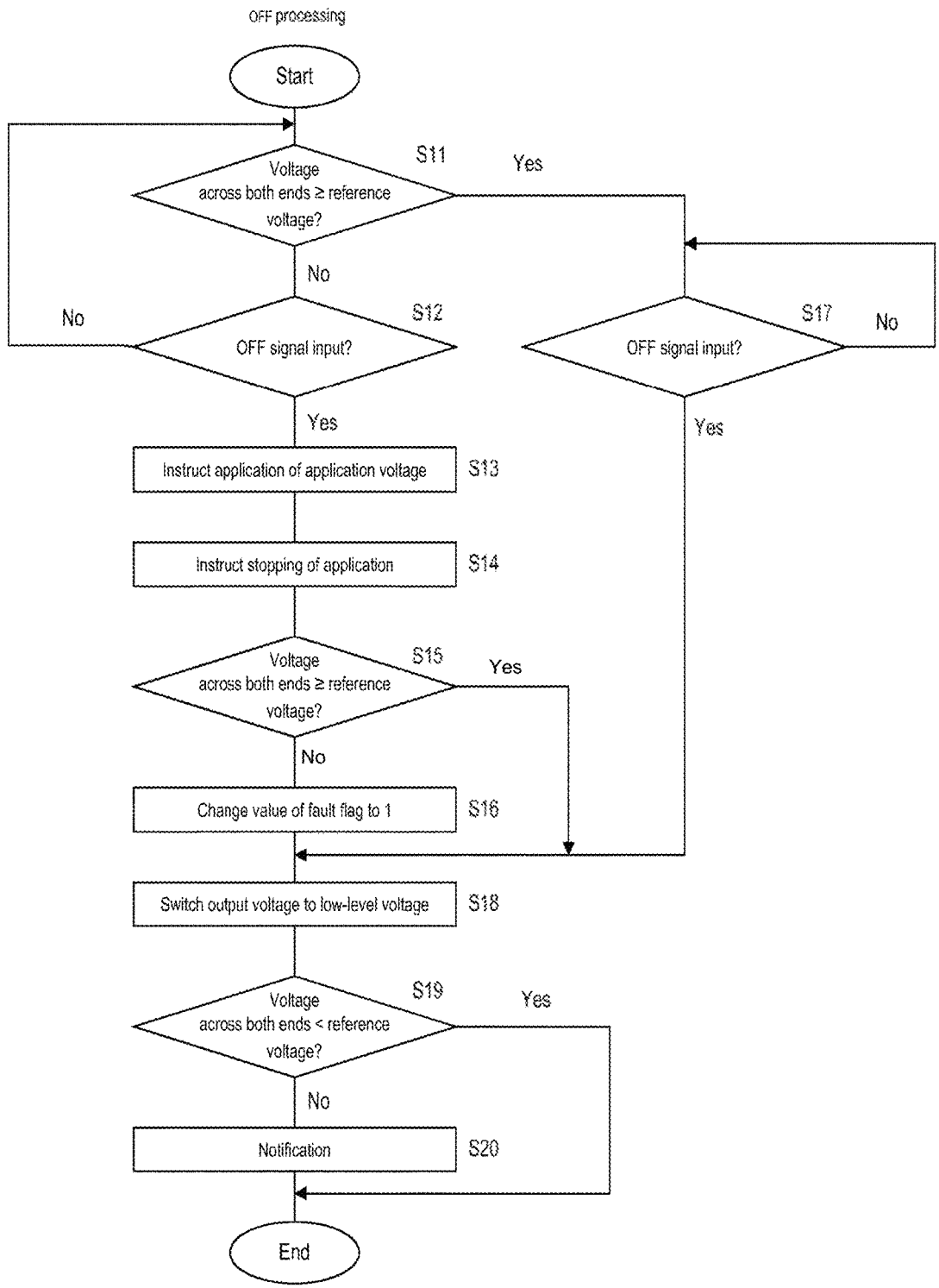
FIG. 7 is a flowchart illustrating a sequence of off processing.

FIG. 7 is a flowchart illustrating a sequence of the off processing. The control unit 76 executes the off processing when the execution of the on processing has ended. The off processing is executed while the output voltage of the output unit 70 is the high-level voltage and the value of the fault flag is zero. At the point in time when the off processing is executed, the adjustment unit 71 causes the application circuit 26 to stop applying the applied voltage by keeping the resistor voltage, which is the voltage at the other end of the circuit resistor 43 of the application circuit 26, at a high voltage.

If, after the execution of the on processing has ended, the switch current is being kept at a current less than a current threshold, the voltage across both ends of the resistor circuit 25 is less than the reference voltage, and thus the output voltage of the comparator 51 is the high-level voltage. When the output voltage of the comparator 51 is the high-level voltage, the latch circuit 52 stops applying the notification voltage.

If, after the execution of the on processing, the switch current has reached a current greater than or equal to the current threshold, the voltage across both ends of the resistor circuit 25 reaches a voltage greater than or equal to the reference voltage, and the comparator 51 switches the output voltage from the high-level voltage to the low-level voltage. As a result, the drive unit 50 switches the FET 20 off. When the output voltage of the comparator 51 is the low-level voltage, the latch circuit 52 continues to apply the notification voltage to the resistor circuit 25 as long as the output voltage of the output unit 70 is being kept at the high-level voltage. As a result, the voltage across both ends of the resistor circuit 25 is kept at a voltage greater than or equal to the reference voltage.

In the off processing, the control unit 76 determines whether or not the voltage across both ends of the resistor circuit 25 is greater than or equal to the reference voltage (step S11). As a result, it is determined whether or not a notification is being made by the latch circuit 52. The voltage across both ends being greater than or equal to the reference voltage means that the notification is being made. The voltage across both ends is obtained from the A/D conversion unit 72. If it is determined that the voltage across both ends is less than the reference voltage (S11: NO), the control unit 76 determines whether or not the off signal has been input to the input unit 73 (step S12). If it is determined that the off signal has not been input (S12: NO), the control unit 76 executes step S11 again, and stands by until the voltage across both ends reaches a voltage greater than or equal to the reference voltage or until the off signal is input.

If it is determined that the off signal has been input (S12: YES), the control unit 76 instructs the application circuit 26 to apply the applied voltage to the resistor circuit 25 (step S13). The control unit 76 instructs the application circuit 26 to apply the applied voltage by causing the adjustment unit 71 to reduce the resistor voltage, which is the voltage at the other end of the circuit resistor 43. As mentioned earlier, when the resistor voltage drops, the transistor 40 switches on, and the application circuit 26 applies the applied voltage to the resistor circuit 25.

If a fault has not occurred in the power supply control device 10, when the applied voltage is applied, the voltage across both ends of the resistor circuit 25 reaches a voltage greater than or equal to the reference voltage. Through this, the drive unit 50 of the drive circuit 23 switches the FET 20 off, and the latch circuit 52 applies the notification voltage to the resistor circuit 25. A notification is made as a result of the notification voltage being applied.

After executing step S13, the control unit 76 instructs the application circuit 26 to stop applying the applied voltage (step S14). The control unit 76 instructs the application circuit 26 to stop applying the applied voltage by causing the adjustment unit 71 to raise the resistor voltage. As mentioned earlier, when the resistor voltage rises, the transistor 40 switches off, and the application circuit 26 stops applying the applied voltage. If a fault has not occurred in the power supply control device 10, the latch circuit 52 continues applying the notification voltage even after the application circuit 26 has stopped applying the applied voltage, and thus the voltage across both ends of the resistor circuit 25 is kept at a voltage greater than or equal to the reference voltage.

After executing step S14, the control unit 76 determines whether or not the voltage across both ends of the resistor circuit 25 is greater than or equal to the reference voltage (step S15). As a result, it is determined whether or not the latch circuit 52 is making a notification. The voltage across both ends being greater than or equal to the reference voltage means that the notification is being made. The voltage across both ends being less than the reference voltage means that the notification is not being made. The control unit 76 tests the latch circuit 52 by executing step S15. If the drive circuit 23 is a single integrated circuit, it is possible that there is a fault in the drive circuit 23 when the latch circuit 52 does not make a notification. By testing the latch circuit 52, the possibility of a fault in the drive circuit 23 can be detected in advance. If it is determined that the voltage across both ends is less than the reference voltage (S15: NO), the control unit 76 changes the value of the fault flag to 1 (step S16).

If it is determined that the voltage across both ends is greater than or equal to the reference voltage (S11: YES), the control unit 76 determines whether or not the off signal has been input to the input unit 73 (step S17). If it is determined that the off signal has not been input (S17: NO), the control unit 76 executes step S17 again, and stands by until the off signal is input.

If it is determined that the voltage across both ends is greater than or equal to the reference voltage (S15: YES), the control unit 76 instructs the output unit 70 to switch the output voltage from the high-level voltage to the low-level voltage (step S18) after step S16 has been executed or if it is determined that the off signal has been input (S17: YES). If the output voltage of the output unit 70 has switched to the low-level voltage while the latch circuit 52 is applying the notification voltage, the latch circuit 52 stops applying the notification voltage. Accordingly, instructing the output unit 70 to switch the output voltage to the low-level voltage corresponds to instructing the latch circuit 52 to stop applying the notification voltage.

If a fault has not occurred in the power supply control device 10, the voltage across both ends of the resistor circuit 25 drops to a voltage less than the reference voltage, e.g., zero V, when the application of the notification voltage stops. The FET 20 is off at the point in time when step S18 is executed. As such, the state of the FET 20 does not change in response to the control unit 76 executing step S18.

After executing step S18, the control unit 76 determines whether or not the voltage across both ends of the resistor circuit 25 is less than the reference voltage (step S19). As a result, it is determined whether or not the voltage across both ends has dropped to a voltage less than the reference voltage. If it is determined that the voltage across both ends is greater than or equal to the reference voltage (S19: NO), the control unit 76 instructs the notification unit 74 to make the notification (step S20). If it is determined that the voltage across both ends is less than the reference voltage (S19: YES), or after executing step S20, the control unit 76 ends the off processing.

Operations of Power Supply Control Device 10

Figure 8:
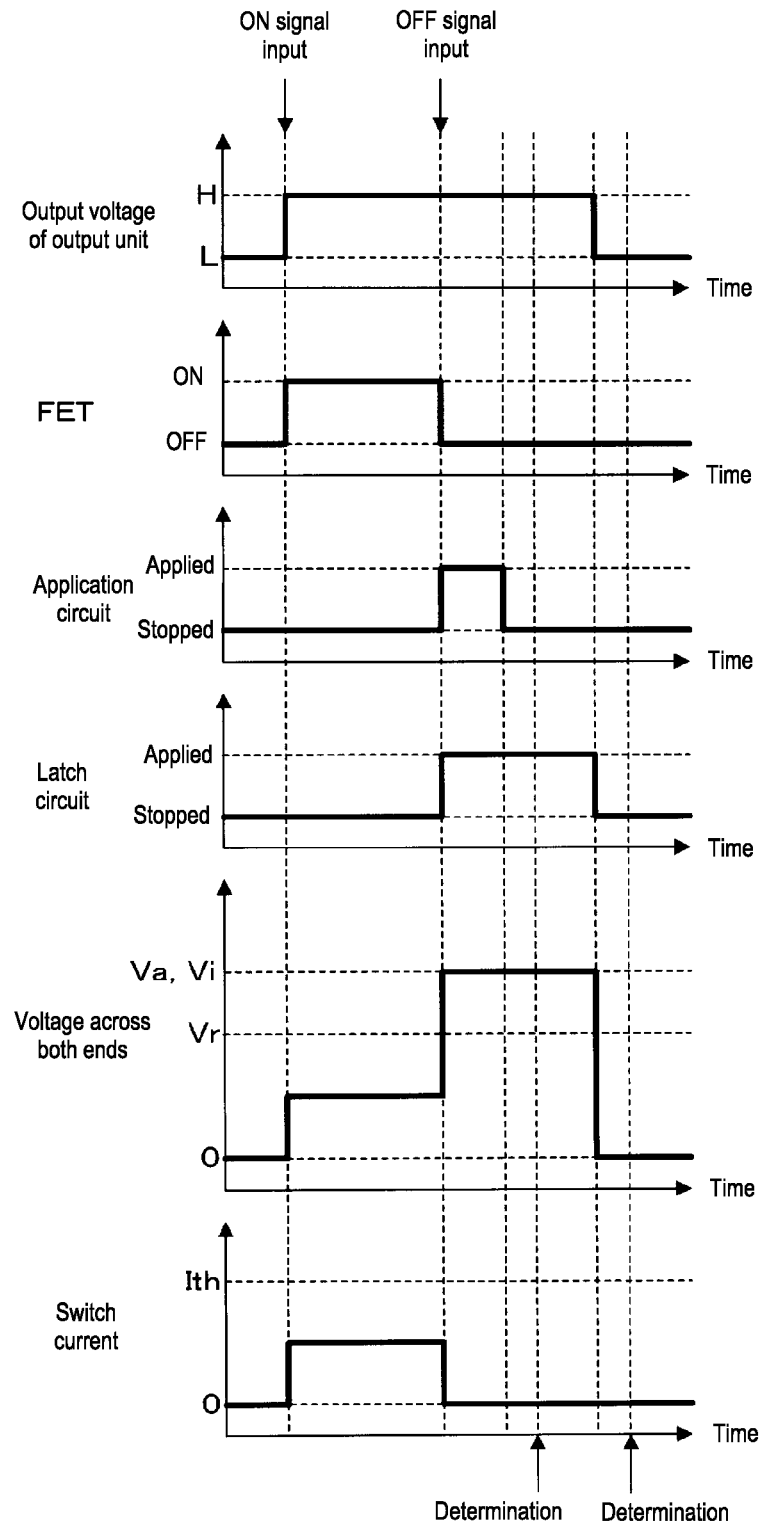
FIG. 8 is a timing chart illustrating operations of a power supply control device.

FIG. 8 is a timing chart illustrating operations of the power supply control device 10. FIG. 8 illustrates transitions in the output voltage of the output unit 70, the state of the FET 20, the state of application by the application circuit 26, the state of application by the latch circuit 52, the voltage across both ends of the resistor circuit 25, and the switch current. "H" and "L" represent the high-level voltage and the low-level voltage, respectively. Va, Vi, Vr, and Ith represent the applied voltage, the notification voltage, the reference voltage, and the current threshold, respectively. FIG. 8 illustrates operations performed when no fault has occurred in the power supply control device 10, and the applied voltage Va is the same as the notification voltage Vi.

As illustrated in FIG. 8, when the output voltage of the output unit 70 is the low-level voltage, the drive unit 50 keeps the FET 20 off, and the switch current is zero A. Because the switch current is zero A, the voltage across both ends of the resistor circuit 25 is zero V, and is therefore less than the reference voltage Vr. When the output voltage of the output unit 70 is the low-level voltage, the application circuit 26 and the latch circuit 52 are not applying the applied voltage and the notification voltage, respectively.

When the on signal is input to the input unit 73 of the microcomputer 27, the control unit 76 instructs the output unit 70 to switch the output voltage from the low-level voltage to the high-level voltage. At this time, the switch current is zero A, and the voltage across both ends of the resistor circuit 25 is less than the reference voltage. Accordingly, the drive unit 50 of the drive circuit 23 switches the FET 20 on. When the FET 20 is switched on, the switch current flows through the FET 20. As a result, the switch current rises to a current that exceeds zero A but is less than the current threshold Ith. Additionally, the voltage across both ends of the resistor circuit 25 rises to a voltage that exceeds zero V but is less than the reference voltage Vr.

When the off signal is input to the input unit 73, the control unit 76 instructs the application circuit 26 to apply the applied voltage Va to the resistor circuit 25. Through this, the voltage across both ends of the resistor circuit 25 rises to the applied voltage Va, which is greater than or equal to the reference voltage Vr. As a result, the drive unit 50 switches the FET 20 off, and the latch circuit 52 applies the notification voltage Vi to the resistor circuit 25. When the FET 20 is switched off, the switch current drops to zero A.

If the applied voltage Va and the notification voltage Vi are different from each other, the voltage across both ends is the same as the higher of the applied voltage Va and the notification voltage Vi while the application circuit 26 and the latch circuit 52 are applying their respective voltages.

After the application circuit 26 applies the applied voltage Va, the control unit 76 instructs the application circuit 26 to stop applying the applied voltage Va. Even if the application of the applied voltage Va has stopped, the latch circuit 52 is applying the notification voltage Vi, and thus the voltage across both ends of the resistor circuit 25 is kept at a voltage greater than or equal to the reference voltage Vr. After instructing the application circuit 26 to stop applying the applied voltage Va, the control unit 76 determines whether or not the voltage across both ends of the resistor circuit 25 is greater than or equal to the reference voltage Vr. As a result, the control unit 76 determines whether or not the latch circuit 52 is making a notification. If it is determined that the voltage across both ends is less than the reference voltage Vr, the control unit 76 changes the value of the fault flag to zero from 1, assuming that a notification is not being made.

After determining whether or not a notification is being made, the control unit 76 instructs the output unit 70 to switch the output voltage from the high-level voltage to the low-level voltage. As a result, the latch circuit 52 stops applying the notification voltage Vi. At this time, the switch current is zero A, and thus the voltage across both ends of the resistor circuit 25 drops to zero V. Zero V is a voltage less than the reference voltage Vr. After the output unit 70 has switched the output voltage to the low-level voltage, the control unit 76 determines whether or not the voltage across both ends has dropped to a voltage less than the reference voltage Vr. Through this, it is confirmed that the voltage across both ends of the resistor circuit 25 has returned to a voltage less than the reference voltage Vr. When the voltage across both ends is greater than or equal to the reference voltage Vr, the control unit 76 causes the notification unit 74 to make a notification.

As described thus far, in the power supply control device 10, the latch circuit 52 is tested at a timing when the off signal is input, i.e., at a timing when the FET 20 is requested to switch off. If no fault is occurring in the power supply control device 10, the FET 20 is switched off at the point in time when the application circuit 26 applies the applied voltage to the resistor circuit 25.

Variations on First Embodiment

It is sufficient for the FET 20 to function as a switch. Accordingly, a P-channel FET, a bipolar transistor, a relay contact, or the like may be used instead of the FET 20. The resistor circuit 25 may be any circuit that includes the detection resistor 30. Accordingly, the resistor circuit 25 may be a circuit in which a circuit device, e.g., a capacitor, is connected to the detection resistor 30 in parallel. The voltage applied to the emitter of the transistor 40 of the application circuit 26 may be any voltage higher than the reference voltage Vr. Accordingly, the voltage applied to the emitter of the transistor 40 may be different from the constant voltage Vc generated by the regulator 22. It is sufficient for the transistor 40 included in the application circuit 26 to function as a switch. Accordingly, a P-channel tFET, a relay contact, or the like may be used instead of the transistor 40.

The application circuit 26 may be any circuit that applies the applied voltage to the resistor circuit 25 in response to an instruction from the microcomputer 27, i.e., from the control unit 76. Accordingly, the application circuit 26 may be a circuit including a processing device, e.g., a CPU. In this case, the processing device of the application circuit 26 instructs the applied voltage to be applied to the resistor circuit 25 in response to an instruction from the control unit 76.

The voltage applied to the emitter of the second transistor 64 of the latch circuit 52 may be any voltage higher than the reference voltage Vr. Accordingly, the voltage applied to the emitter of the second transistor 64 may be different from the constant voltage Vc generated by the regulator 22. It is sufficient for the second transistor 64 included in the latch circuit 52 to function as a switch. Accordingly, a P-channel FET, a relay contact, or the like may be used instead of the second transistor 64.

The latch circuit 52 may be any circuit that applies the notification voltage and stops the application of the notification voltage based on the output voltage of the output unit 70 included in the microcomputer 27 and the output voltage of the comparator 51. Accordingly, the application circuit 26 may be a circuit including a processing device, e.g., a CPU. In this case, the processing device of the application circuit 26 determines whether or not to apply the notification voltage, whether or not to stop the application of the notification voltage, and the like based on the output voltages of the output unit 70 and the comparator 51.

The timing at which the latch circuit 52 is tested is not limited to the timing at which the off signal is input to the input unit 73 of the microcomputer 27. The control unit 76 of the microcomputer 27 may test the latch circuit 52 periodically. The timing at which the latch circuit 52 stops applying the notification voltage is not limited to the timing at which the output voltage of the output unit 70 switches from the high-level voltage to the low-level voltage, and may be, for example, a timing at which the set amount of time has passed after the notification voltage is applied.

The notification made by the latch circuit 52 is not limited to a notification realized by applying the notification voltage, and may, for example, be a notification realized by outputting a signal indicating that the voltage across both ends of the resistor circuit 25 has reached a voltage greater than or equal to the reference voltage.

Second Embodiment

In the first embodiment, the power supply control device 10 is disposed upstream from the load 12 in the current path of the current flowing from the positive electrode to the negative electrode of the DC power source 11. However, the location where the power supply control device 10 is disposed is not limited to being upstream from the load 12.

Points of the second embodiment that are different from the first embodiment will be described hereinafter. The rest of the configuration, aside from the points described below, is the same as in the first embodiment. As such, constituent elements that are the same as in the first embodiment will be given the same reference signs as in the first embodiment, and will not be described.

Configuration of Power Source System 1

Figure 9:
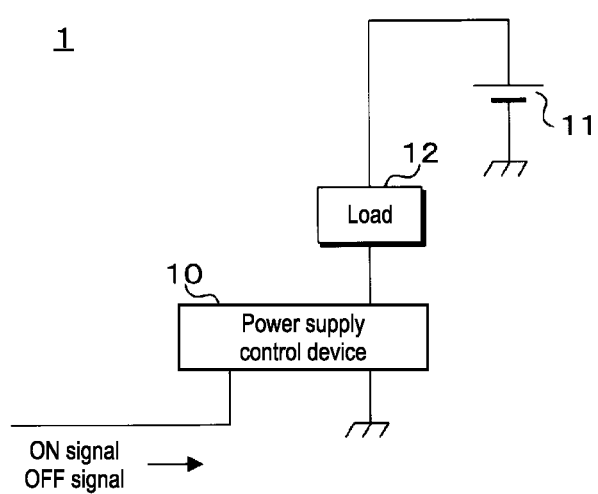
FIG. 9 is a block diagram illustrating the primary configuration of a power source system according to a second embodiment.

FIG. 9 is a block diagram illustrating the primary configuration of a power source system 1 according to the second embodiment. Comparing the power source system 1 in the second embodiment with the power source system 1 in the first embodiment, the power supply control device 10 is disposed in a different location. In the power source system 1 of the second embodiment, the power supply control device 10 is disposed downstream from the load 12 in the path of the current flowing from the positive electrode to the negative electrode of the DC power source 11.

The positive electrode of the DC power source 11 is connected to one end of the load 12. If the power supply control device 10 includes the FET 20, the drain of the FET 20 is connected to the other end of the load 12. Similar to the first embodiment, the source of the FET 20 is connected to one end of the shunt resistor 21. The other end of the shunt resistor 21 is grounded. Similar to the first embodiment, the negative electrode of the DC power source 11 is grounded.

The effects achieved by the power supply control device 10 in the second embodiment are similar to those achieved by the power supply control device 10 in the first embodiment.

The first and second embodiments disclosed here are intended to be in all ways exemplary and in no ways limiting. The scope of the present disclosure is defined not by the foregoing descriptions but by the scope of the claims, and is intended to include all changes equivalent in meaning to and falling within the scope of the claims.

The invention claimed is:

1. A power supply control device that controls a supply of power by switching a switch on or off, the power supply control device comprising:
 a resistor circuit in which a current that rises when a current flowing through the switch rises flows;
 a notifying circuit configured to make a notification when a voltage across both ends of the resistor circuit being greater than or equal to a predetermined voltage;
 a switching unit configured to switch the switch off when the voltage across both ends of the resistor circuit reaches a voltage greater than or equal to the predetermined voltage;
 an application circuit configured to apply a voltage greater than or equal to the predetermined voltage to the resistor circuit; and
 a processing unit configured to execute processing,
 wherein the processing unit:
 instructs the application circuit to apply the voltage to the resistor circuit;
 determines whether or not the notifying circuit is making the notification after instructing the application circuit to apply the voltage;
 instructs the application circuit to stop applying the voltage after instructing the application circuit to apply the voltage; and
 after instructing the application circuit to stop applying the voltage, determines whether or not the notifying circuit is making the notification based on the voltage across both ends of the resistor circuit; and
 instructs the application circuit to apply the voltage to the resistor circuit when an off signal instructing the switch to turn off is input.

2. The power supply control device according to claim 1, wherein the processing unit:
 instructs the notifying circuit to stop applying the voltage when the notifying circuit is determined to be making the notification, and
 after instructing the notifying circuit to stop applying the voltage, determines whether or not the voltage across both ends of the resistor circuit is less than the predetermined voltage.

3. A test method, executed by a computer, for testing a notifying circuit that makes a notification when a voltage across both ends of a resistor circuit, in which a current that rises when a current flowing through the switch rises flows, reaches a voltage greater than or equal to a predetermined voltage, the test method comprising:
 a step of instructing a voltage greater than or equal to the predetermined voltage to be applied to the resistor circuit when an off signal instructing the switch to turn off is input;
 a step of providing a switching unit configured to switch a switch off when the voltage across both ends of the resistor circuit reaches a voltage greater than or equal to the predetermined voltage;
 a step of determining whether or not the notifying circuit is making the notification after instructing the voltage to be applied to the resistor circuit;

a step of stopping the application of the voltage to the resistor circuit after instructing the voltage to be applied; and a step of determining whether or not a notification is made after stopping the application of the voltage.

4. A computer program product comprising a non-transitory, machine-readable medium storing instructions which, when executed by at least one programmable processor, causes at least one programmable processor to test a notifying circuit that makes a notification when a voltage across both ends of a resistor circuit, in which a current that rises when a current flowing through the switch rises flows, reaches a voltage greater than or equal to a predetermined voltage, the at least one programmable processor further configured to perform operations comprising:

a step of instructing a voltage greater than or equal to the predetermined voltage to be applied to the resistor circuit when an off signal instructing the switch to turn off is input;

a step of turning off a switch when the voltage across both ends of the resistor circuit reaches a voltage greater than or equal to the predetermined voltage;

a step of predetermining whether or not the notifying circuit is making the notification after instructing the voltage to be applied to the resistor circuit;

a step of stopping the application of the voltage to the resistor circuit after instructing the voltage to be applied; and a step of determining whether or not a notification is made after stopping the application of the voltage.

\* \* \* \* \*